United States Patent
Wang

(10) Patent No.: US 12,308,071 B2
(45) Date of Patent: May 20, 2025

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Kuo-Chiang Wang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 240 days.

(21) Appl. No.: 18/111,676

(22) Filed: Feb. 20, 2023

(65) Prior Publication Data

US 2024/0282361 A1    Aug. 22, 2024

(51) Int. Cl.
G11C 11/4093 (2006.01)
H10B 12/00 (2023.01)
H10B 80/00 (2023.01)

(52) U.S. Cl.
CPC .......... *G11C 11/4093* (2013.01); *H10B 12/09* (2023.02); *H10B 12/50* (2023.02); *H10B 80/00* (2023.02)

(58) Field of Classification Search
CPC .... G11C 11/4093; G11C 11/409; H10B 12/50
USPC .................................................. 365/189.05
See application file for complete search history.

(56) References Cited

U.S. PATENT DOCUMENTS

| | | | |
|---|---|---|---|
| 9,543,952 B2* | 1/2017 | Lee | G11C 29/021 |
| 10,651,979 B1* | 5/2020 | Katakwar | H03K 5/22 |
| 11,190,188 B2* | 11/2021 | Cho | G11C 7/1057 |
| 11,237,766 B2 | 2/2022 | Seong et al. | |
| 2017/0200611 A1 | 7/2017 | Park et al. | |
| 2018/0018913 A1* | 1/2018 | Kim | G09G 3/2092 |
| 2019/0237144 A1 | 8/2019 | Kim | |
| 2019/0259429 A1* | 8/2019 | Heo | G11C 29/028 |
| 2022/0350749 A1* | 11/2022 | Artieri | G06F 12/12 |
| 2022/0398438 A1 | 12/2022 | Zhang et al. | |
| 2023/0386979 A1* | 11/2023 | Bautista | H01L 24/32 |

FOREIGN PATENT DOCUMENTS

CN    109840223 A    6/2019

OTHER PUBLICATIONS

Office Action and and the search report mailed on Nov. 23, 2023 related to Taiwanese Application No. 112119891.

* cited by examiner

*Primary Examiner* — Muna A Techane
(74) *Attorney, Agent, or Firm* — Xuan Zhang

(57) ABSTRACT

A semiconductor device and a method for manufacturing a semiconductor device are provided. The semiconductor device includes a memory cell array, a memory interface, a first peripheral circuit, and a second peripheral circuit. The first peripheral circuit supports a first memory protocol, and the second peripheral circuit, supports a second memory protocol different from the first memory protocol. The first peripheral circuit and the second peripheral circuit share the memory cell array and the memory interface.

16 Claims, 9 Drawing Sheets

SEMICONDUCTOR DEVICE AND METHOD FOR MANUFACTURING THE SAME

TECHNICAL FIELD

The present disclosure relates to a semiconductor device, and more particularly, to a semiconductor device and a method for manufacturing the same.

DISCUSSION OF THE BACKGROUND

An LPDDR4 (Low-power Double Data Rate 4) memory is the mobile equivalent of a DDR4 (Double Data Rate 4) memory. Compared to the DDR4 memory, the LPDDR4 memory offers reduced power consumption at the cost of bandwidth. LPDD4 has dual 16-bit channels resulting in a 32-bit total bus per DIMM. In comparison, DDR4 features one 64-bit channel per DIMM. LPDDR4 makes up for this by adopting a wider prefetch of 16n for a total of (16 words×16 bit) 256 bits per channel and twice that for both channels combined.

Moreover, LPDDR4X drops I/O voltage (i.e., VDDQ) of LPDDR4 by approximately 50% (i.e., 1.1V to 0.6V), significantly reducing the power draw for both the memory as well as the memory controllers. In addition, LPDDR4 increases the bandwidth from 3200 Mb/s to 4266 Mb/s. In addition to the I/O voltage and bandwidth, LPDDR4X is different from LPDDR4 in other aspects, such as density, I/O interface, ODT_CA_pin, power efficiency, and settings of the mode register set.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a memory cell array, a memory interface, a first peripheral circuit, and a second peripheral circuit. The first peripheral circuit supports a first memory protocol, and the second peripheral circuit supports a second memory protocol different from the first memory protocol. The first peripheral circuit and the second peripheral circuit share the memory cell array and the memory interface.

Another aspect of the present disclosure provides a method, which includes the following steps: fabricating a plurality of semiconductor devices on a silicon wafer using a set of masks; and cutting each of the semiconductor devices from the silicon wafer and packaging each of the semiconductor devices into a memory chip. Each memory chip comprises a memory interface and a memory cell array that support a first memory protocol and a second memory protocol. The first memory protocol is different from the second memory protocol.

Another aspect of the present disclosure provides a method, which includes the following steps: obtaining a plurality of memory chips fabricated on a silicon wafer using one set of masks, wherein each of the plurality of memory chips comprises a memory interface, an eFuse, a first peripheral circuit, a second peripheral circuit, and a memory cell array; dividing the plurality of memory chips into a first category and a second category; breaking the eFuse to disconnect the memory interface from the second peripheral circuit for each memory chip in the first category to support a first memory protocol; and breaking the eFuse to disconnect the memory interface from the first peripheral circuit for each memory chip in the second category to support a second memory protocol. The second memory protocol is different from the first memory protocol.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
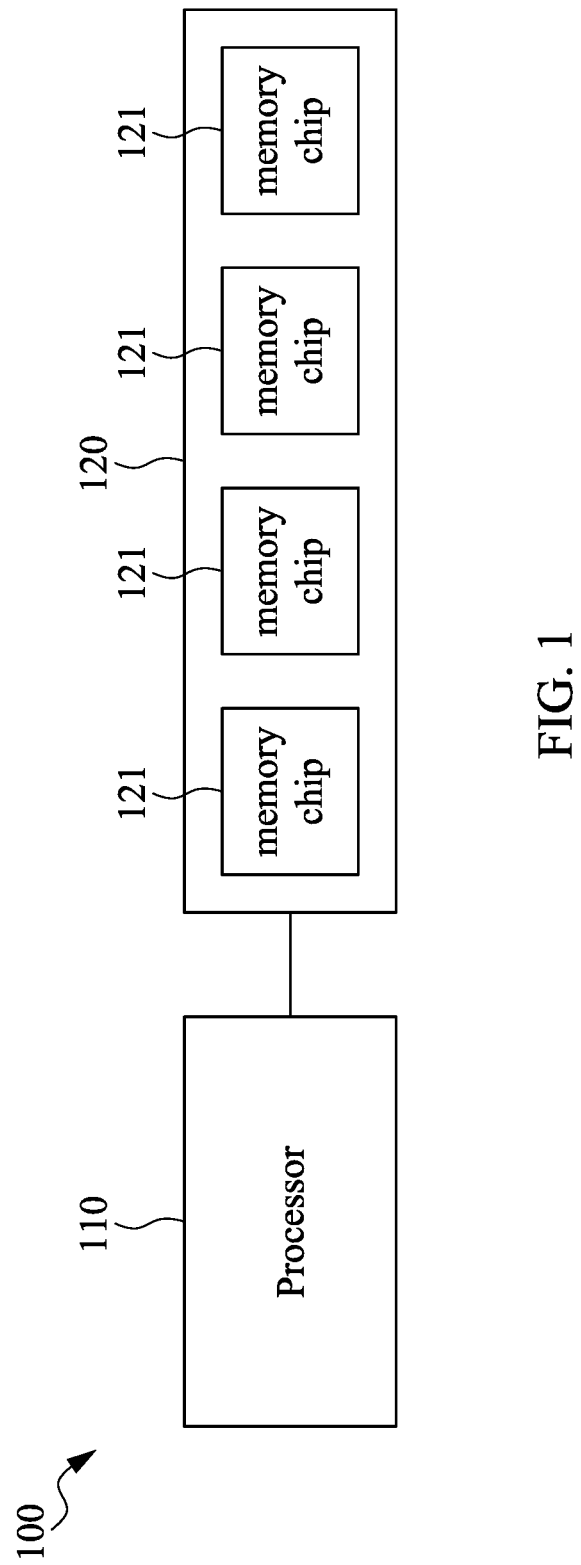
FIG. 1 is a block diagram of an electronic device 100 in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of an electronic device 100 in accordance with some embodiments of the present disclosure.

The electronic device 100 includes a processor 110 and a memory module 120. The processor 110 may be a central processing unit (CPU) which communicates with the memory 120 using a predefined memory protocol, such as LPDDR4 and LPDDR4X, or LPDDR5 and LPDDR5X, but the disclosure is not limited thereto. Table 1 compares LPDDR4 and LPDDR4X protocols in various aspects.

TABLE 1

| Function | LPDDR4 | LPDDR4X |
| --- | --- | --- |
| Data Rate | 3200 to 4266 Mbps | 3200 to 4266 Mbps |
| Density | 4 Gb to 32 Gb | Dual: 4-32 Gb Single: 2-16 Gb |
| Pre-fetch | 16 | 16 |
| Bit line (BL) | BL16/32 | BL16/32 |
| ADD/CMD | SDR | SDR |
| DQ | DDR | DDR |
| I/O Interface | LVSTL_11 | LVSTLE_06 |
| JEDEC 2-CH Arch. | 2CHx16 | 2CHx16 |
| Bank | 8 per channel | 8 per channel |
| VDD1(V) | 1.8 | 1.8 |
| VDD2(V) | 1.1 | 1.1 |
| VDDQ(V) | 1.1 | 0.6 |
| VOH(mV) | VDDQ/2.5 = 440 VDDQ/3 = 367 | 0.5*VDDQ = 300 0.6*VDDQ = 360 |
| ODT_CA pin | Yes | Not Available |
| Power Efficiency | 1x | Output Drive 0.55x IDD4R 0.8x |

As shown in Table 1, the primary differences between LPDDR4 and LPDDR4X are the I/O interface and the voltage $V_{OH}$. Since LPDDR4 and LPDDR4X respectively use 1.1V and 0.6V as the voltage VDDQ, LPDDR4X is more power efficient than LPDDR4.

Moreover, the settings of mode register set of LPDDR4 are slightly different from those of LPDDR4X. For example, operand [7](i.e., OP[7]) of mode register 0 (MR[0]) in LPDDR4 defines CATR while OP[7] of MR[0] in LPDDR4X is a "Reserved" field. OP[7] of MR[12] in LPDDR4 is an "RFU" (reserved for future use) field while OP[7] of MR[12] in LPDDR4X may define the CBT (command bus training) mode. OP[7] and OP[6] of MR[22] in LPDDR4 is an "RFU" field while OP[7] and OP[6] of MR[22] in LPDDR4X defines ODT (on-die termination) for x8_2ch(Byte) mode.

For purposes of description, the LPDDR4 and LPDDR4X memory protocols are used in the following embodiments. The memory module 120 may include one or more memory chips 121, and the memory size of the memory module 120 depends on the number of memory chips 121 thereon. In some embodiments, the memory module 120 may be a dual in-line memory module (DIMM), but the disclosure is not limited thereto.

Figure 2:
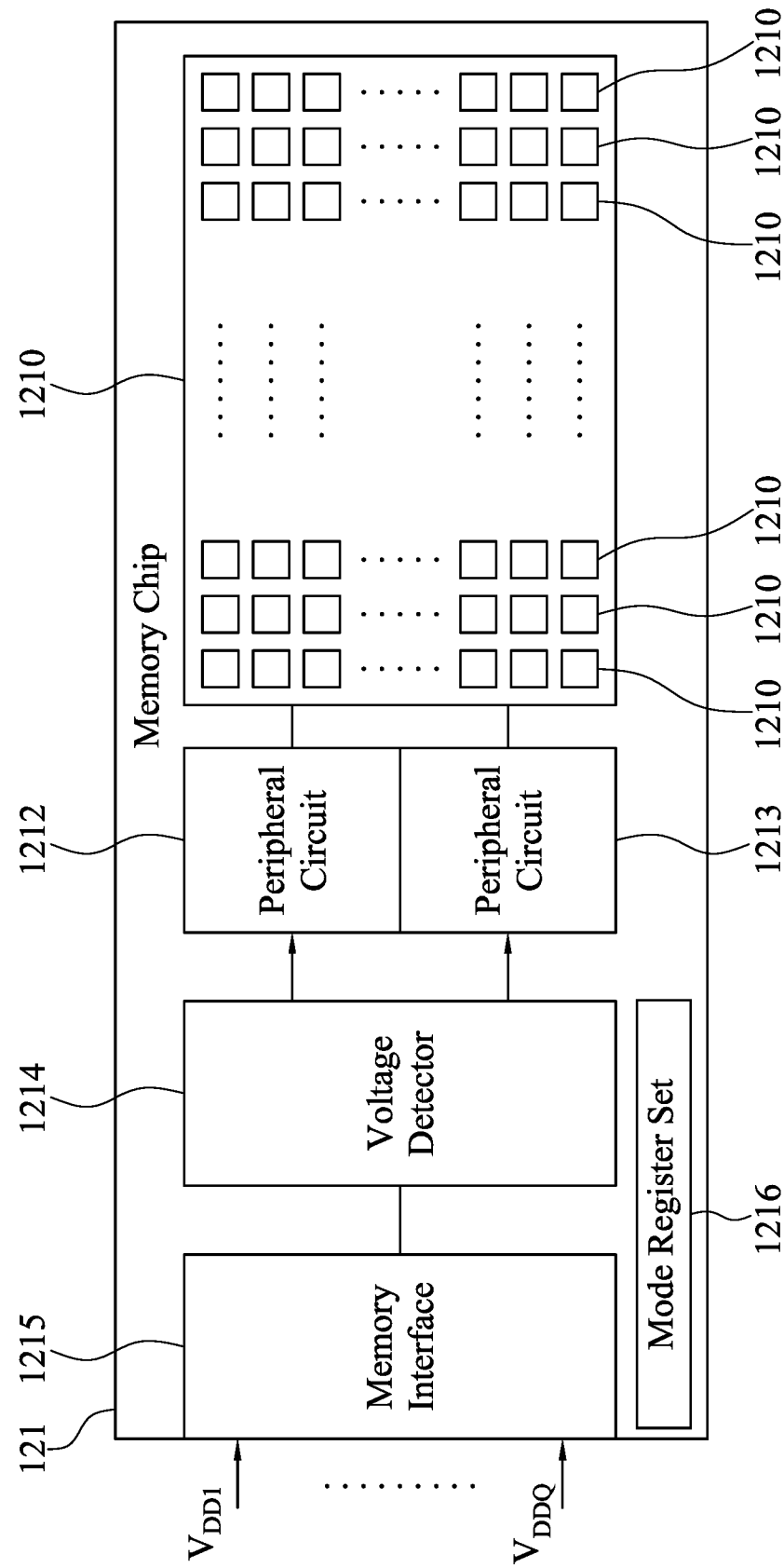
FIG. 2 is a block diagram of the memory chip in accordance with the embodiment of FIG. 1.

FIG. 2 is a block diagram of the memory chip in accordance with the embodiment of FIG. 1. Please refer to FIG. 1 and FIG. 2.

As shown in FIG. 2, each memory chip 121 may include a memory cell array 1210, peripheral circuits 1212 and 1213, a voltage detector 1214, and a memory interface 1215. The memory cell array 1210 may include a plurality of memory cells 1211 that are arranged in a two-dimensional array. The memory interface 1215 may be a universal memory interface compatible with the LPDDR4 and LPDDR4X memory protocols. For example, the I/O interfaces of LPDDR4 and LPDDR4X may be LVSTL_11 and LVSTLE_06 I/O standards defined by the JEDEC (Joint Electron Device Engineering Council), respectively. However, the number of pins of the LVSTL_11 and LVSTLE_06 I/O standards are the same, and a majority of the pins in the LVSTL_11 and LVSTLE_06 I/O standards are the same. In addition, the definitions of pins that are not the same between the LVSTL_11 and LVSTLE_06 I/O standards can be alternated depending on the currently used memory protocol (e.g., LPDDR4 or LPDDR4X) determined by the voltage detector 1214, where the details will be described later.

The peripheral circuit 1212 may include control circuits (e.g., row decoder, column decoder, driving circuit, pre-charging circuit, etc.) and readout circuits (e.g., sense amplifier, etc.) compatible with the LPDDR4 protocol. The peripheral circuit 1213 may include control circuits and readout circuits compatible with the LPDDR4X protocol. It should be noted that the processor 110 communicates with the memory module 120 using a predefined memory protocol because the processor 110 may control the external power supply voltages (e.g., VDD1, VDD2, and VDDQ) provided to the memory module 120, and set the register values in the mode register set corresponding to the predefined memory protocol through the memory interface 1215. If the power supply voltages provided to the memory module 120 or the registers values in the mode register set are incorrect, the processor 110 will not be able to communicate with the memory module 120 normally.

The voltage detector 1214 may be configured to activate one of the peripheral circuits 1212 and 1213 according to the determination result of the currently used memory protocol between the processor 110 and the memory module 120, so the memory interface 1215 can be connected to the memory cell array 1210 through the activated peripheral circuit 1212 or 1213. The voltage detector 1214 may detect the voltage level of the external power supply voltage VDDQ to determine whether LPDDR4 or LPDDR4X memory protocol is used between the processor 110 and the memory module 120.

Figures 3A, 3B:
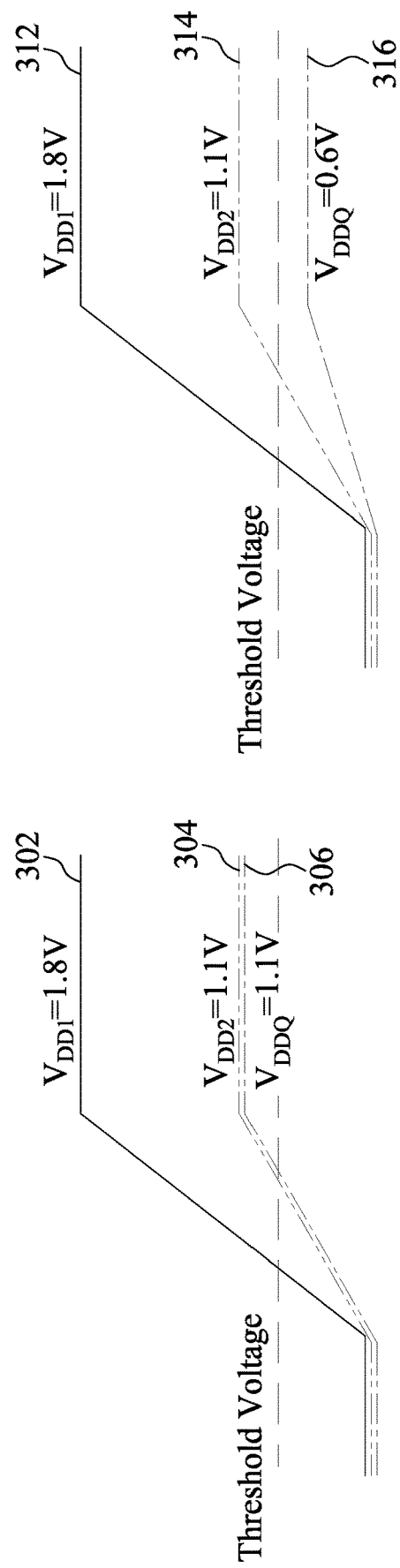
FIG. 3A is a timing diagram of the external power supply voltages VDD1, VDD2, and VDDQ for the LPDDR4 protocol in accordance with an embodiment of the disclosure.
FIG. 3B is a timing diagram of the external power supply voltages VDD1, VDD2, and VDDQ for the LPDDR4X protocol in accordance with an embodiment of the disclosure.

A timing diagram of the external power supply voltages VDD1, VDD2, and VDDQ for the LPDDR4 protocol is shown in FIG. 3A. For example, the external power supply voltage VDDQ of LPDDR4 is 1.1V, and that of LPDDR4X is 0.6V. Upon the electronic device 100 being booted up, if the LPDDR4 protocol is used by the processor 110 and the memory module 120, the external power supply voltages VDD1, VDD2, and VDDQ will gradually increase from 0V to 1.8V, 1.1V, and 1.1V, as shown by curves 302, 304, and 306, respectively.

A timing diagram of the external power supply voltages VDD1, VDD2, and VDDQ for the LPDDR4X protocol is shown in FIG. 3B. Upon the electronic device 100 being booted up, if the LPDDR4X protocol is used by the processor 110 and the memory module 120, the external power supply voltages VDD1, VDD2, and VDDQ will gradually increase from 0V to 1.8V, 1.1V, and 0.6V, as shown by curves 312, 314, and 316, respectively.

Thus, there is a voltage margin between the external power supply voltages VDDQ used by the LPDDR4 and LPDDR4X protocols, and the voltage margin is approximately 0.5V. In addition, the variations of the external power supply voltage VDDQ are also considered by the voltage detector 1214. In an embodiment, in response to the voltage detector 1214 detecting that the external power supply voltage VDDQ is higher than or equal to 1.1V (i.e., first threshold voltage), the voltage detector 1214 determines that the LPDDR4 protocol is used by the processor 110 and the memory module 120, and connects the memory interface 1215 to the peripheral circuit 1212, so the peripheral circuit 1212 can control the memory cell array 1210 using the LPDDR4 protocol.

In addition, in response to the voltage detector 1214 detecting that the external power supply voltage VDDQ is lower than or equal to 0.6V (i.e., second threshold voltage), the voltage detector 1214 determines that the LPDDR4X protocol is used by the processor 110 and the memory module 120, and connects the memory interface 1215 to the peripheral circuit 1213, so the peripheral circuit 1213 can control the memory cell array 1210 using the LPDDR4X protocol.

In another embodiment, the voltage detector 1214 may define a threshold voltage to distinguish the voltage level of the external power supply voltage VDDQ used by the LPDDR4 from that used by the LPDDR4X. For example, the threshold voltage may be (1.1+0.6)/2=0.85V, which is the middle point of the voltage margin. Thus, in response to the voltage detector 1214 detecting that the external power supply voltage VDDQ is higher than or equal to threshold voltage (e.g., 0.85V), the voltage detector 1214 determines that the LPDDR4 protocol is used by the processor 110 and the memory module 120, and connects the memory interface 1215 to the peripheral circuit 1212, so the peripheral circuit 1212 can control the memory cell array 1210 using the LPDDR4 protocol. In addition, in response to the voltage detector 1214 detecting that the external power supply voltage VDDQ is lower than threshold voltage (e.g., 0.85V), the voltage detector 1214 determines that the LPDDR4X protocol is used by the processor 110 and the memory module 120, and connects the memory interface 1215 to the peripheral circuit 1213, so the peripheral circuit 1213 can control the memory cell array 1210 using the LPDDR4X protocol. It should be noted that the threshold voltage can be set to any voltage within this margin according to practical conditions.

Figure 4:
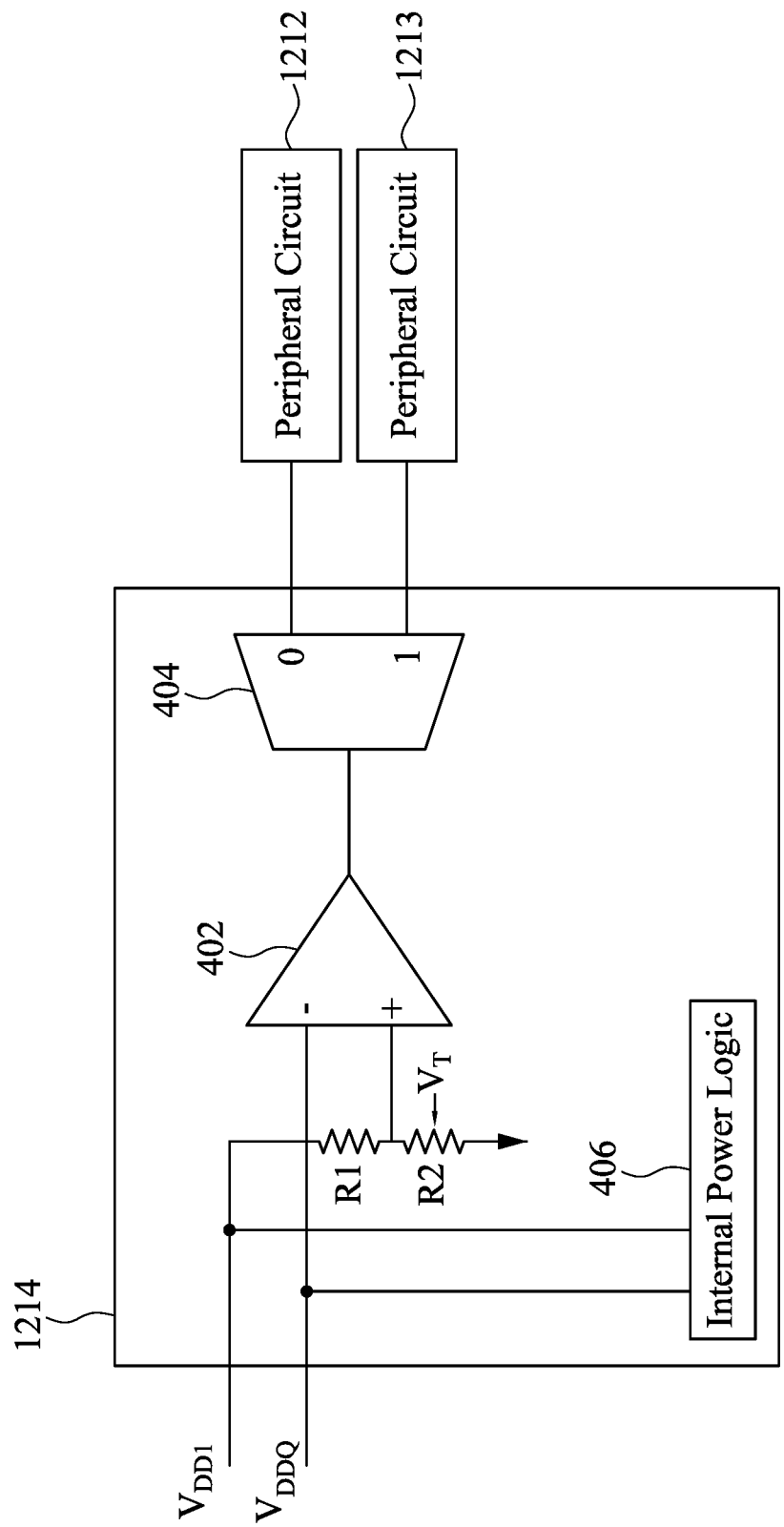
FIG. 4 is a schematic diagram of the voltage detector in accordance with the embodiment of FIG. 2.

FIG. 4 is a schematic diagram of the voltage detector in accordance with the embodiment of FIG. 2. Please refer to FIG. 1, FIG. 2, and FIG. 4.

The voltage detector 1214 may include a comparator 402, a demultiplexer (DEMUX) 404, and internal power logic 406. The comparator 402 may be configured to compare the external power supply voltage $V_{DDQ}$ with a threshold voltage. In some embodiments, the comparator 402 may be implemented using an operational amplifier, as shown in FIG. 4. The demultiplexer 404 is configured to connect the memory interface 1215 to the peripheral circuit 1212 or 1213 according to the output (i.e., determination result) of the comparator 402. The internal power logic 406 may be configured to provide power to the memory chips 121 on the memory module 120.

The threshold voltage $V_T$ is generated by a voltage divider which includes resistors R1 and R2. For example, the resistor R1 has a fixed resistance. The resistor R2 may be implemented by a potentiometer, which has variable resistance. Accordingly, the threshold voltage can be adjusted by changing the resistance of the resistor R2.

As shown in FIG. 4, since the voltage $V_{DD1}$ is known for the LPDDR4 and LPDDR4X protocols, the threshold voltage $V_T$ can be calculated using Formula (1):

$$V_T = \frac{R2 \times V_{DD1}}{(R1 + R2)} \quad (1)$$

Thus, the designer of the voltage detector 1214 can adjust the threshold voltage VT by changing the resistance of the resistor R2 according to practical needs. In addition, the external power supply voltage VDDQ is fed into the negative terminal of the comparator 402, and the threshold voltage VT is fed into the positive terminal of the comparator 402. When the threshold voltage VT is greater than or equal to the external power supply voltage VDDQ, the output of the comparator 402 is in a high logic state, so the demultiplexer 404 will select terminal 1 to connect the memory interface 1215 to the peripheral circuit 1213. In this case, memory chip 121 will operate in the LPDDR4X mode, and the I/O pin definitions of the memory interface 215 follows the LPDDR4X protocol.

When the threshold voltage VT is lower than then external power supply voltage VDDQ, the output of the comparator 402 will be in a low logic state, so the demultiplexer 404 will select terminal 0 to connect the memory interface 1215 to the peripheral circuit 1212. In this case, memory chip 121 will operate in the LPDDR4 mode, and the I/O pin definitions of the memory interface 1215 follows the LPDDR4 protocol.

It should be noted that FIG. 4 is an example for implementing the voltage detector 1214, and one of ordinary skill in the art could modify the comparator 402, demultiplexer 404, and voltage divider using known or later developed equivalent circuits.

Figure 5:
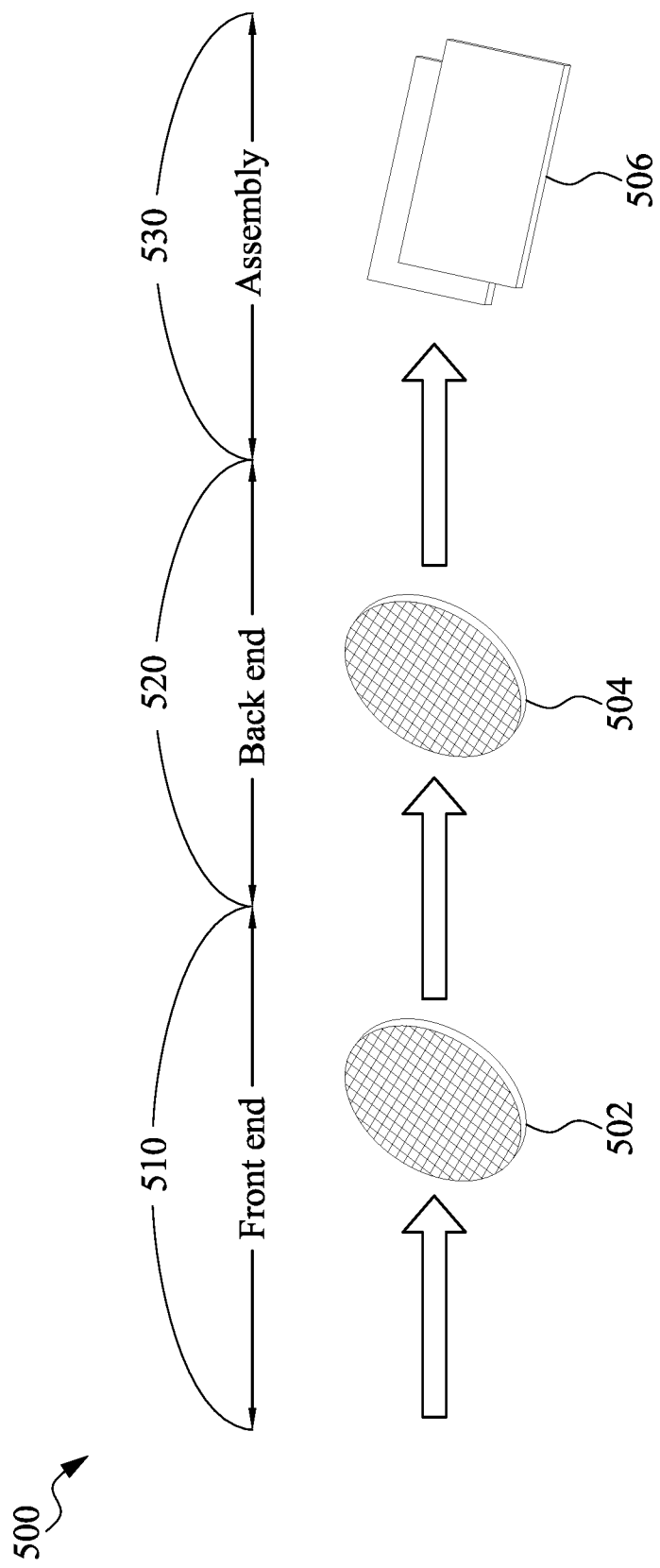
FIG. 5 is a diagram of the semiconductor manufacturing process of the memory chip in accordance with an embodiment of the disclosure.

FIG. 5 is a diagram of the semiconductor manufacturing process of the memory chip in accordance with an embodiment of the disclosure. Please refer to FIG. 2 and FIG. 5.

In an embodiment, the semiconductor manufacturing process 500 of the memory chip 121 can be divided into three stages, namely, front-end stage 510, back-end stage 520, and assembly stage 530. The front-end stage 510 may refer to the wafer fabrication and probing process, such as thin-film deposition, lithography, etching, diffusion, ionic implantation, metal deposition, passivation, back-lap, etc. The semiconductor devices including large-scale integrated circuits (LSIs) are created on the silicon wafer 502 in the front-end stage 510. In some cases, the front-end stage 510 may include the front-end-of-line (FEOL) processes and the mid-end-of-line (MoL or MEOL) processes.

Then, the integrated circuits created on the silicon wafer 502 undergo the back-end stage 520 which includes die cutting and wire bonding. During the die-cutting operation, the silicon wafer 504 is cut into individual chips. During the wire-bonding operation, the chip is fixed to the lead frame (i.e., die bonding), wherein a lead frame is thin metal support for a chip that serves as a terminal for mounting a semiconductor device on a board.

The assembly stage 530 can be regarded as molding or packaging. Since the chips are delicate and can be affected by scratches, shocks, dust, and magnetism, the chip is encased in epoxy resin to protect it. After the assembly stage 530, the chips 506 undergo an inspection process before being shipped.

More specifically, the memory cells for LPDDR4 and those for LPDDR4X are substantially the same, and they can operate normally using different external power supply voltages VDDQ, such as 1.1V and 0.6V. Thus, these memory cells can be used in common for LPDDR4 and LPDDR4X. Thus, during the semiconductor manufacturing process of the memory chip 121, one set of masks can be used to produce the memory cell array 1210 for dual use (i.e., LPDDR4 and LPDDR4X), thereby simplifying the semiconductor manufacturing process and significantly reducing the manufacturing costs. In addition, two peripheral circuits 1212 and 1213 are implemented for each memory chip 121, and they share the same memory interface 1215. Since the memory cell array 1210 occupies a large portion of area (e.g., approximately 90% or above) of the memory chip 121, the overhead for implementing an additional peripheral circuit can be almost overlooked in the semiconductor manufacturing process.

The voltage detector 1214 can detect whether the external power supply voltage VDDQ is for LPDDR4 or LPDDR4X so as to set the corresponding operation mode of the memory chip 121, such as connecting the corresponding peripheral circuit 1212 or 1213 to the memory interface 1215. Thus, after the booting process, the processor 110 can communicate with the memory chips 121 on the memory module 120 normally. Therefore, the user of the electronic device 100 does not need to set the memory protocol used by the memory module 120, and the memory chips 121 on the memory module 120 can detect the voltage level of the external power supply voltage VDDQ to determine whether the LPDDR4 or LPDDR4X memory protocol is currently used by processor 110 and the memory module 120, thereby improving convenience for using the "dual-memory-protocol" memory chips.

Figure 6:
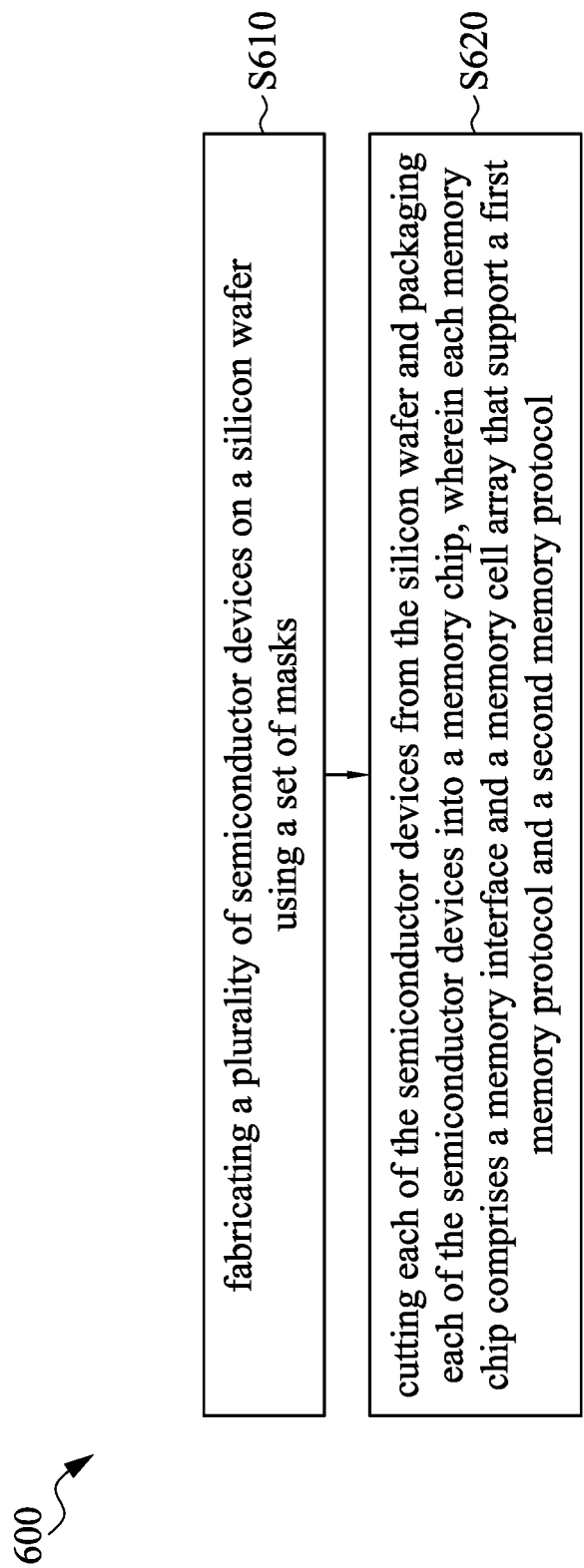
FIG. 6 is a flowchart of a method for manufacturing a semiconductor device in accordance with an embodiment of the disclosure.

FIG. 6 is a flowchart of a method 600 for manufacturing a semiconductor device in accordance with an embodiment of the disclosure. Please refer to FIG. 2 and FIG. 6.

The method 600 includes steps S610 and S620. In step S610, a plurality of semiconductor devices are fabricated on a silicon wafer using a set of masks. For example, the set of masks may include one pattern of the memory cell array 1210 and the patterns of the peripheral circuits 1212 and 1213. In addition, the LPDDR4 and LPDDR4X protocols can use the same memory cell array 1210, but the peripheral circuits for these two memory protocols are not compatible with each other, so two peripheral circuits 1212 and 1213 are designed respectively for the LPDDR4 and LPDDR4X protocols.

In step S620, each of the semiconductor devices is cut from the silicon wafer and packaged into a memory chip, wherein the memory chip includes a memory interface and a memory cell array that support a first memory protocol and a second memory protocol. The first memory protocol is different from the second memory protocol. For example, the first memory protocol and the second memory protocol may be LPDDR4 and LPDDR4X, or LPDDR5 and LPDDR5X, respectively. In addition, the peripheral circuits 1212 and 1213 share the same memory interface 1215 and the memory cell array 1210. The details for operating the memory chip can be referred to the embodiment of FIG. 9.

The method 600 is merely an example, and is not intended to limit the present disclosure beyond what is explicitly recited in the claims. Additional operations can be provided before, during, or after each operation of the method 600, and some operations described can be replaced, eliminated, or reordered for additional embodiments of the method. In some embodiments, the method 600 can include further operations not depicted in FIG. 6. In some embodiments, the method 200 can include one or more operations depicted in FIG. 6.

Figure 7:
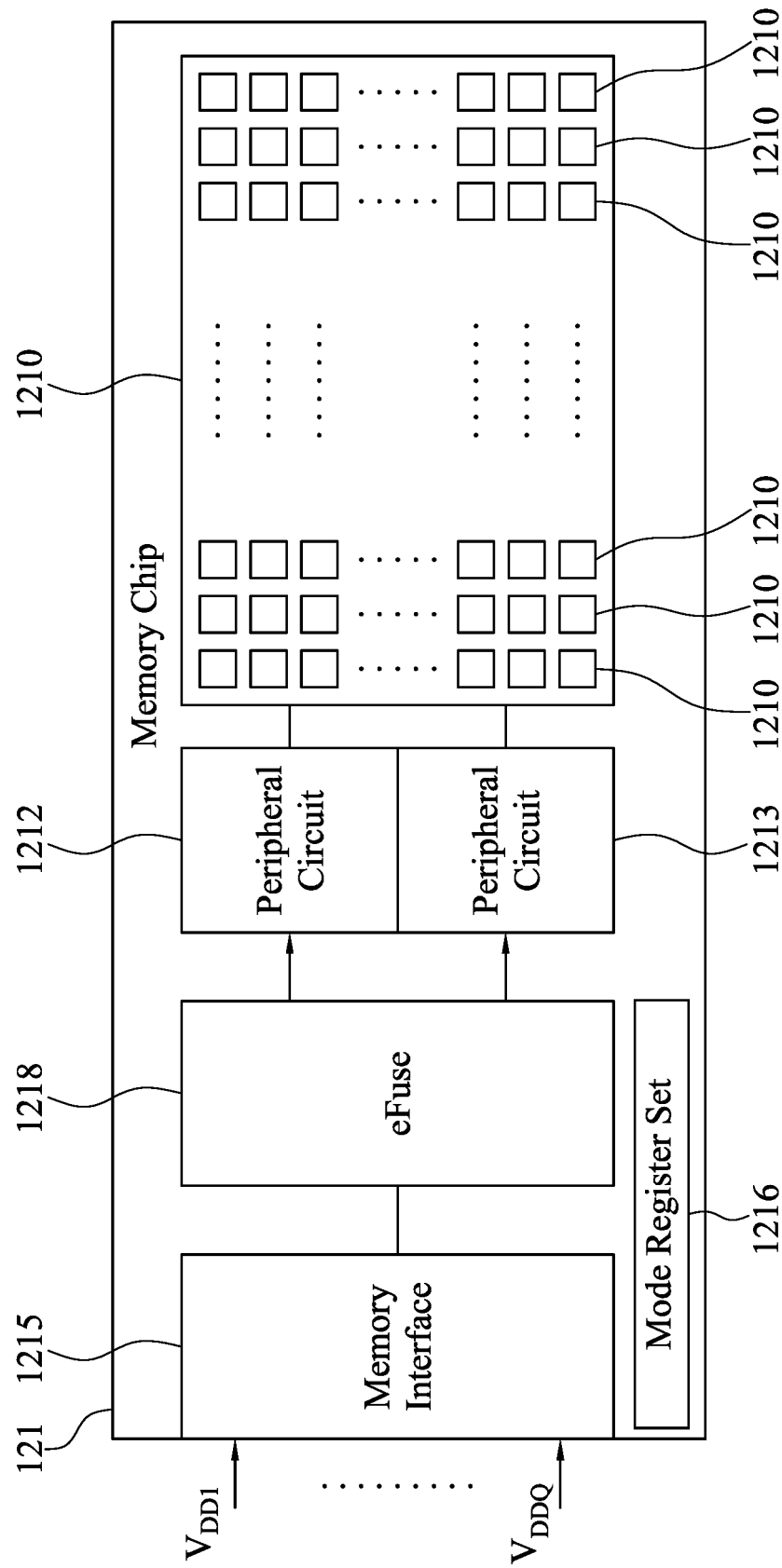
FIG. 7 is a block diagram of the memory chip in accordance with another embodiment of the disclosure.
Figure 8:
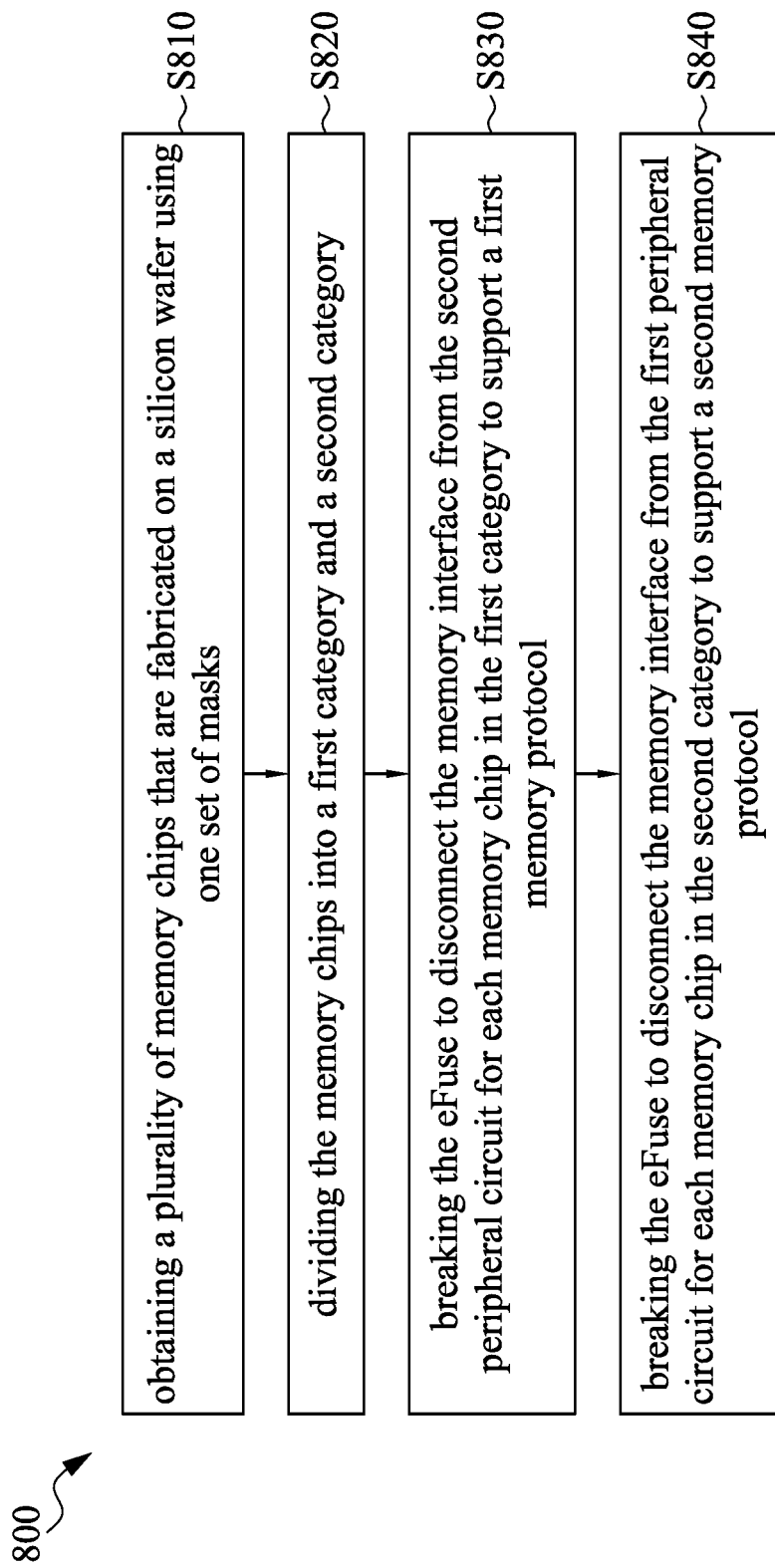
FIG. 8 is a flowchart of the semiconductor manufacturing process of the memory chip in accordance with the embodiment of FIG. 7.

FIG. 7 is a block diagram of the memory chip in accordance with another embodiment of the disclosure. FIG. 8 is a flowchart of the semiconductor manufacturing process of the memory chip in accordance with the embodiment of FIG. 7. Please refer to FIG. 1, FIG. 7, and FIG. 8.

The memory chip 121 shown in FIG. 6 is similar to the memory chip 121 shown in FIG. 2. The difference between FIG. 2 and FIG. 7 is that the voltage detector 1214 is substituted with the eFuse (electronically programmable fuse) 1218. More specifically, the memory chip 121 shown in FIG. 7 also includes peripheral circuits 1212 and 1213 respectively for LPDDR4 and LPDDR4X protocols. However, the semiconductor manufacturing process of the memory chips 121 in FIG. 7 is different from the semiconductor manufacturing process 500 shown in FIG. 5.

Attention now is directed to FIG. 8, which illustrates a flowchart of the semiconductor manufacturing process of the memory chip in FIG. 7. In step S810, a plurality of memory chips that are fabricated on a silicon wafer using one set of masks are obtained. Each of the semiconductor devices comprises a memory interface 181, an eFuse 1218, a first peripheral circuit (e.g., peripheral circuit 1212), a second peripheral circuit (e.g., peripheral circuit 1213), and a memory cell array 1210.

In step S820, the memory chips 121 are divided into a first category and a second category. It should be noted that after the circuits, eFuse, and memory cells of each semiconductor device are fabricated on the silicon wafer (i.e., through the FEOL), the eFuse connects the memory interface 1215 to both the peripheral circuits 1212 and 1213.

In step S830, the eFuse 1218 is broken to disconnect the memory interface 1215 from the second peripheral circuit for the first category of the memory chips 121. In step S840, the eFuse 1218 is broken to disconnect the memory interface 1215 from the first peripheral circuit for the second category of the memory chips 121. Specifically, since the first category and the second category are respectively dedicated for the first memory protocol and the second memory protocol (e.g., LPDDR4 and LPDDR4X, or LPDDR5 and LPDDR5X), the operations in step S830 and S840 are performed to alternate the original connection within the memory chip 121 by the eFuse 1218, which is irreversible. Thus, after performing steps S830 and S840, the first category of memory chips 121 is dedicated for the first memory protocol, and the second category of memory chips 121 is dedicated for the second memory protocol.

Figure 9:
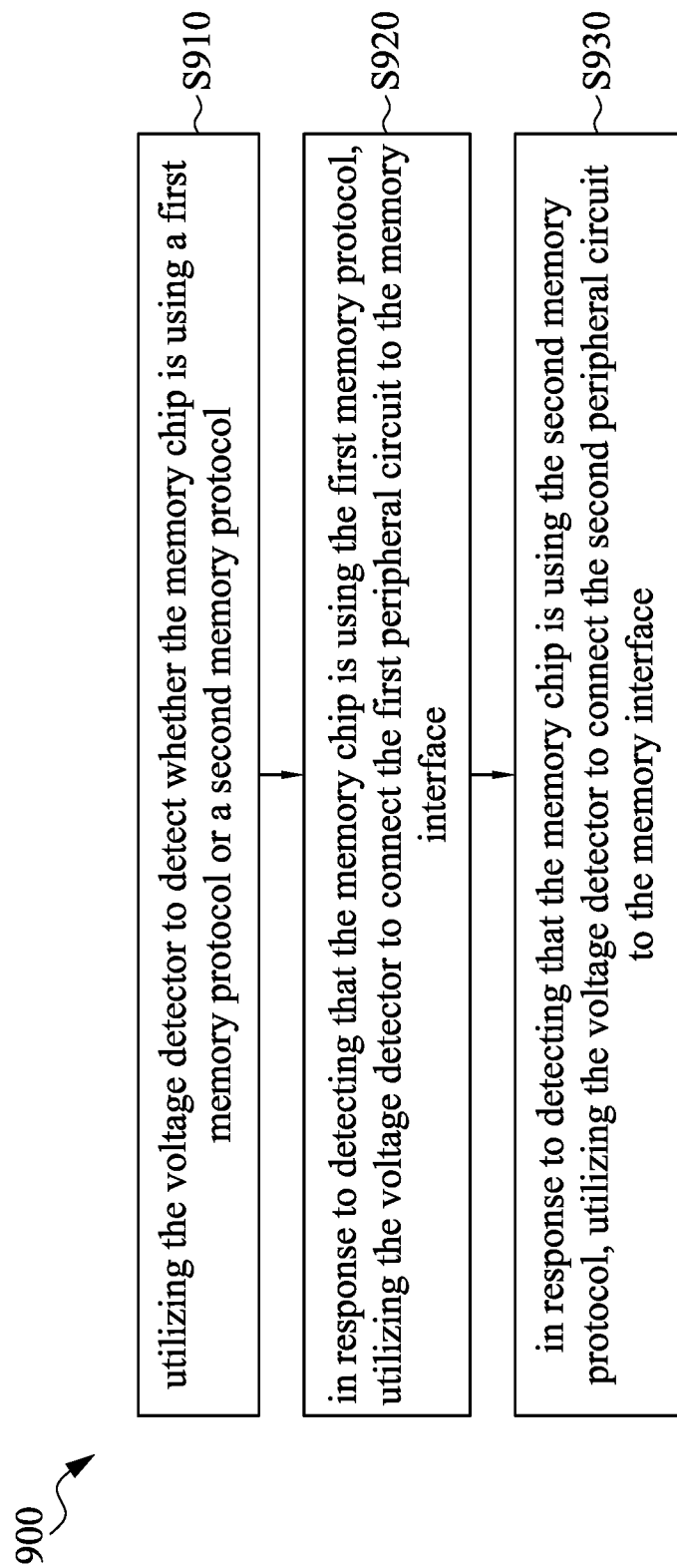
FIG. 9 is a flowchart of a method for operating the memory chip in accordance with an embodiment of the disclosure.

FIG. 9 is a flowchart of a method for operating the memory chip in accordance with an embodiment of the disclosure. Please refer to FIG. 2 and FIG. 9.

The method 900 includes step S910 to S930. In step S910, the voltage detector 1214 is utilized to detect whether the memory chip 121 is using a first memory protocol or a second memory protocol. For example, since the memory chip 121 supports the first memory protocol and the second memory protocol (e.g., LPDDR4 and LPDDR4X, or LPDDR5 and LPDDR5X), the memory protocol currently used by the memory chip 121 can be determined by the external power supply voltage VDDQ.

In step S920, in response to detecting that the memory chip 121 is using the first memory protocol, the voltage detector 1214 is utilized to connect the first peripheral circuit to the memory interface 1215.

In step S930, in response to detecting that the memory chip 121 is using the second memory protocol, the voltage detector 1214 is utilized to connect the second peripheral circuit to the memory interface 1215. For example, the voltage detector 1214 may define a threshold voltage (e.g., using the voltage divider shown in FIG. 4) to distinguish the voltage level of the external power supply voltage VDDQ used by the LPDDR4 from that used by the LPDDR4X.

For example, the threshold voltage may be (1.1+0.6)/2=0.85V, which is the middle point of the voltage margin between 1.1V and 0.6V. In response to the voltage detector 1214 detecting that the external power supply voltage VDDQ is higher than or equal to threshold voltage (e.g., 0.85V), the voltage detector 1214 determines that the LPDDR4 protocol is used by the processor 110 and the memory module 120, and connects the memory interface 1215 to the peripheral circuit 1212, so the peripheral circuit 1212 can control the memory cell array 1210 using the LPDDR4 protocol. In addition, in response to the voltage detector 1214 detecting that the external power supply voltage VDDQ is lower than threshold voltage (e.g., 0.85V), the voltage detector 1214 determines that the LPDDR4X protocol is used by the processor 110 and the memory module 120, and connects the memory interface 1215 to the peripheral circuit 1213, so the peripheral circuit 1213 can control the memory cell array 1210 using the LPDDR4X protocol.

The method 900 is merely an example, and is not intended to limit the present disclosure beyond what is explicitly recited in the claims. Additional operations can be provided before, during, or after each operation of the method 900, and some operations described can be replaced, eliminated, or reordered for additional embodiments of the method. In some embodiments, the method 900 can include further operations not depicted in FIG. 9. In some embodiments, the method 900 can include one or more operations depicted in FIG. 9.

One aspect of the present disclosure provides a semiconductor device. The semiconductor device includes a memory cell array, a memory interface, a first peripheral circuit, and a second peripheral circuit. The first peripheral circuit supports a first memory protocol, and the second peripheral circuit, supports a second memory protocol different from the first memory protocol. The first peripheral circuit and the second peripheral circuit share the memory cell array and the memory interface.

Another aspect of the present disclosure provides a method, which includes the following steps: fabricating a plurality of semiconductor devices on a silicon wafer using a set of masks; and cutting each of the semiconductor devices from the silicon wafer and packaging each of the semiconductor devices into a memory chip. Each memory chip comprises a memory interface and a memory cell array that support a first memory protocol and a second memory protocol. The first memory protocol is different from the second memory protocol.

Another aspect of the present disclosure provides a method, which includes the following steps: obtaining a plurality of memory chips that are fabricated on a silicon wafer using one set of masks, wherein each of the plurality of memory chips comprises a memory interface, an eFuse, a first peripheral circuit, a second peripheral circuit, and a memory cell array; dividing the plurality of memory chips into a first category and a second category; breaking the eFuse to disconnect the memory interface from the second peripheral circuit for each memory chip in the first category to support a first memory protocol; and breaking the eFuse to disconnect the memory interface from the first peripheral circuit for each memory chip in the second category to support a second memory protocol. The second memory protocol is different from the first memory protocol.

In some embodiments, the semiconductor device includes a voltage detector configured to detect whether the semiconductor device is using the first memory protocol or the second memory protocol. The voltage detector defines a threshold voltage, and determines whether an external power supply voltage provided to the semiconductor device is higher than or equal to the threshold voltage. In response to the voltage detector determining that the external power supply voltage is higher than or equal to the threshold voltage, the voltage detector connects the memory interface to the first peripheral circuit. In response to the voltage detector determining that the external power supply voltage is lower than the threshold voltage, the voltage detector connects the memory interface to the second peripheral circuit.

In some embodiments, the voltage detector includes a voltage divider configured to define the threshold voltage, and the voltage divider includes a first resistor and a second resistor. The first resistor has a fixed resistance, and the second resistor is a potentiometer having a variable resistance. The voltage detector further includes a comparator and a demultiplexer. The comparator is configured to compare the external power supply voltage with the threshold voltage to generate a determination result. The demultiplexer is configured to connect the first peripheral circuit or the second peripheral circuit to the memory interface according to the determination result.

In some embodiments, the voltage detector defines a first threshold voltage and a second threshold voltage, and the first threshold voltage is higher than the second threshold voltage. In response to the voltage detector determining that an external power supply voltage provided to the semiconductor device is higher than or equal to the first threshold voltage, the voltage detector connects the first peripheral circuit to the memory interface. In response to the voltage detect determining that the external power supply voltage is lower than the second threshold voltage, the voltage detector connects the second peripheral circuit to the memory interface.

In some embodiments, the first memory protocol is LPDDR4 (Low-power Double Data Rate 4), and the second memory protocol is LPDDR4X (Low-power Double Data Rate 4X). Alternatively, the first memory protocol is LPDDR5 (Low-power Double Data Rate 5), and the second memory protocol is LPDDR5X (Low-power Double Data Rate 5X).

In some embodiments, the semiconductor device is fabricated on a silicon wafer using a set of masks. The pin definitions of the memory interface changes in response to the first memory protocol or the second memory protocol used by the semiconductor device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising: a memory cell array; a memory interface; a first peripheral circuit, supporting a first memory protocol; a second peripheral circuit, supporting a second memory protocol different from the first memory protocol; and a voltage detector configured to detect whether the semiconductor device is using the first memory protocol or the second memory protocol; wherein the first peripheral circuit and the second peripheral circuit share the memory cell array and the memory interface; wherein I/O (input/output) pin definitions of the memory interface changes in response to the first memory protocol or the second memory protocol used by the semiconductor device; wherein the first peripheral circuit or the second peripheral circuit is activated in response to an output signal from the voltage detector.

2. The semiconductor device of claim 1, wherein the voltage detector defines a threshold voltage, and determines whether an external power supply voltage provided to the semiconductor device is higher than or equal to the threshold voltage.

3. The semiconductor device of claim 2, wherein in response to the voltage detector determining that the external power supply voltage is higher than or equal to the threshold voltage, the voltage detector connects the memory interface to the first peripheral circuit.

4. The semiconductor device of claim 3, wherein in response to the voltage detector determining that the external power supply voltage is lower than the threshold voltage, the voltage detector connects the memory interface to the second peripheral circuit.

5. The semiconductor device of claim 4, wherein the voltage detector comprises a voltage divider configured to define the threshold voltage, and the voltage divider comprises a first resistor and a second resistor, wherein the first resistor has a fixed resistance, and the second resistor is a potentiometer having a variable resistance.

6. The semiconductor device of claim 5, wherein the voltage detector further comprises:
a comparator, configured to compare the external power supply voltage with the threshold voltage to generate a determination result; and
a demultiplexer, configured to connect the first peripheral circuit or the second peripheral circuit to the memory interface according to the determination result.

7. The semiconductor device of claim 1, wherein the voltage detector defines a first threshold voltage and a second threshold voltage, and the first threshold voltage is higher than the second threshold voltage.

8. The semiconductor device of claim 7, wherein in response to the voltage detector determining that an external power supply voltage provided to the semiconductor device is higher than or equal to the first threshold voltage, the voltage detector connects the first peripheral circuit to the memory interface.

9. The semiconductor device of claim 8, wherein in response to the voltage detector determining that the external power supply voltage is lower than the second threshold voltage, the voltage detector connects the second peripheral circuit to the memory interface.

10. The semiconductor device of claim 1, wherein the first memory protocol is LPDDR4 (Low-power Double Data Rate 4), and the second memory protocol is LPDDR4X (Low-power Double Data Rate 4X).

11. The semiconductor device of claim 1, wherein the first memory protocol is LPDDR5 (Low-power Double Data Rate 5), and the second memory protocol is LPDDR5X (Low-power Double Data Rate 5X).

12. The semiconductor device of claim 1, wherein the semiconductor device is fabricated on a silicon wafer using a set of masks.

13. A method for manufacturing a semiconductor device, comprising: fabricating a plurality of semiconductor devices on a silicon wafer using a set of masks; cutting each of the semiconductor devices from the silicon wafer and packaging each of the semiconductor devices into a memory chip, wherein each memory chip comprises a memory interface, a memory cell array that support a first memory protocol and a second memory protocol, a first peripheral circuit supporting the first memory protocol, a second peripheral circuit supporting the second memory protocol, and a voltage detector; and utilizing the voltage detector to detect whether the memory chip is using the first memory protocol or the second memory protocol; wherein the first peripheral circuit and the second peripheral circuit share the memory cell array and the memory interface; wherein the first memory protocol is different from the second memory protocol; wherein I/O (input/output) pin definitions of the memory interface changes in response to the first memory protocol or the second memory protocol used by the semiconductor device; wherein the first peripheral circuit or the second peripheral circuit is activated in response to an output signal from the voltage detector.

14. The method of claim 13, further comprising:
utilizing the voltage detector to define a threshold voltage; and
utilizing the voltage detector to whether an external power supply voltage provided to the memory chip is higher than or equal to the threshold voltage.

15. The method of claim 14, further comprising:
in response to the voltage detector determining that the external power supply voltage is higher than or equal to the threshold voltage, utilizing the voltage detector to connect the memory interface to the first peripheral circuit.

16. The method of claim 15, further comprising:
in response to the voltage detector determining that the external power supply voltage is lower than the threshold voltage, utilizing the voltage detector to connect the memory interface to the second peripheral circuit.

\* \* \* \* \*